(12) United States Patent
Mitsuiki

(10) Patent No.: US 6,376,383 B2
(45) Date of Patent: *Apr. 23, 2002

(54) METHOD FOR ETCHING SILICON LAYER

(75) Inventor: Akira Mitsuiki, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/233,089

(22) Filed: Jan. 19, 1999

(30) Foreign Application Priority Data

Jan. 16, 1998 (JP) .......................................... 10-007082

(51) Int. Cl.$^7$ ......................................... H01L 21/3065
(52) U.S. Cl. ...................... 438/706; 438/710; 438/712; 438/713
(58) Field of Search ................................ 438/706, 710, 438/712, 713, 719, 723; 156/345; 216/72

(56) References Cited

U.S. PATENT DOCUMENTS

| | | | | |
|---|---|---|---|---|
| 4,352,724 A | * | 10/1982 | Sugishima et al. | 204/192 |
| 4,389,294 A | * | 6/1983 | Anantha et al. | 204/192 |
| 4,656,497 A | * | 4/1987 | Roger et al. | 357/50 |
| 5,338,398 A | * | 8/1994 | Szwejkowski et al. | 156/655 |
| 5,369,061 A | * | 11/1994 | Nagayama | 438/228 |
| 5,458,734 A | * | 10/1995 | Tsukamoto | 156/643.1 |
| 5,706,164 A | * | 1/1998 | Jeng | 361/321.4 |
| 5,717,294 A | * | 2/1998 | Sakai et al. | 315/111.41 |
| 5,767,018 A | * | 6/1998 | Bell | 438/696 |
| 5,801,083 A | * | 9/1998 | Yu et al. | 438/424 |
| 5,856,239 A | * | 1/1999 | Bashir et al. | 438/738 |
| 5,882,535 A | * | 3/1999 | Stocks et al. | 216/18 |
| 5,900,163 A | * | 5/1999 | Yi et al. | 216/79 |
| 5,933,759 A | * | 8/1999 | Nguyen et al. | 438/700 |
| 6,080,680 A | * | 6/2000 | Lee et al. | 438/727 |

FOREIGN PATENT DOCUMENTS

| | | |
|---|---|---|
| EP | 871 213 | 10/1998 |
| GB | 2 316 805 | 3/1998 |
| JP | 57-170535 | 10/1982 |
| JP | 58-17619 | 2/1983 |
| JP | 5-259269 | 8/1993 |
| JP | 8-262489 | 10/1996 |
| JP | 8-274078 | 10/1996 |
| JP | 9-266197 | 10/1997 |

OTHER PUBLICATIONS

JP 10177992 (Sharp) WPI Abstract Acc No. 98–424114, Abstract only.

* cited by examiner

*Primary Examiner*—Robert Kunemund
*Assistant Examiner*—Lan Vinh
(74) *Attorney, Agent, or Firm*—Foley & Lardner

(57) ABSTRACT

A gate oxide film and a polysilicon layer are formed on a silicon substrate, and a pattern of photoresist is formed on the polysilicon layer. A silicon layer is etched halfway using a CF type gas such as $CF_4$, $CHF_3$, $CH_2F_2$ and $C_4F_8$ or a mixed gas including the same with the photoresist serving as a mask. This leaves fluorocarbon type deposition on sides of the etched hole. Then, any residue of the silicon film is etched using the gas of $Cl_2$, HBr, $SF_6$ or $O_2$. This makes it possible to provide a configuration having inclined sides after etching.

7 Claims, 8 Drawing Sheets

(b)

(b)

METHOD FOR ETCHING SILICON LAYER

BACKGROUND OF THE INVENTION

1. Field of the Invention

The present invention relates to a method for etching a silicon layer which makes it possible to provide a configuration having inclined sides through etching.

2. Description of the Related Art

Structures of devices such as flash memories having a floating gate must have a laminated layer configuration as shown in FIG. 1 before a polycide film to serve as a transistor gate is etched. That is, there is a WSi layer 31 which is the uppermost layer followed by a second polysilicon layer 30, an ONO layer 29 having a three-layer structure formed by an oxide film, a nitride film and an oxide film layer, a first polysilicon layer 28, an oxide film layer 27 and a silicon substrate 26. In this structure, the first polysilicon layer 27 to serve as a floating gate is etched in advance vertically as viewed in the cross section. A field oxide film 32 is locally formed in a location where the first polysilicon layer 28 is etched. As shown in FIG. 1, the sides of the hole formed by etching the first polysilicon layer 28 are inclined such that the hole is wider in the upper part. Such a laminated layer structure is etched using an etching apparatus for polysilicon.

While the two upper layers, i.e., the ONO layer 29 and second polysilicon layer 30, are etched without any problem under normal etching conditions, the oxide films in the ONO layer 29 can not be etched at a high etching rate as in a normal etching apparatus exclusively used for oxide films because a polysilicon etching apparatus is used. It is therefore preferable that the ONO layer 29 has a configuration that can be easily etched.

However, as shown in FIG. 2, when the first polysilicon layer 28 is etched in a configuration having vertical sides, the ONO layer 29 thereon will be also formed vertically. If the oxide film layers of the ONO layer 29 are etched vertically relative to the substrate, the thickness of the oxide film layers which is the effective thickness to be etched is equal to the thickness of the first polysilicon film 28. This consequently makes it very difficult to remove the ONO layer 29 and an ONO layer 33 can remain as shown in FIG. 3.

Therefore, in order to make the ONO layer 29 easy to etch, the first polysilicon layer 28 must have a tapered configuration is inclined to be wider in the upper part thereof instead of a vertical configuration.

However, conventional methods for etching have not been effective in providing a configuration having inclined sides as described above after etching. For example, Japanese patent Application Laid-Open No. 8-274078 discloses a method of preventing a gate electrode from being tapered by performing etching having two stages to form a side protection film with different degrees of ease. However, this method does not provide a tapered etching configuration.

SUMMARY OF THE INVENTION

It is an object of the invention to provide a method for etching a silicon layer wherein an etching configuration having inclined sides can be obtained.

According to a first aspect of the invention, there is provided a method for etching a silicon layer comprises the steps of forming a mask pattern on a silicon layer, etching the silicon layer halfway using a CF type gas or a mixed gas including the same and etching any residue of the silicon layer using at least one kind of gas selected from among a group of gases consisting of $Cl_2$, HBr, $SF_6$ and $O_2$.

In this method for etching, the CF type gas may be at least one kind of gas selected from among a group of gases consisting of $CF_4$, $CHF_3$, $CH_2F_2$ and $C_4F_8$ and an oxide film having a thin thickness in the range from 6 nm to 10 nm may be provided under the silicon layer.

According to the present invention, the silicon layer is first etched halfway using a CF type gas or a mixed gas including the same. This leaves a fluorocarbon type deposition on the sides of an etched hole. Then, any residue of the silicon layer is etched using the gas of $Cl_2$, HBr, $SF_6$ or $O_2$. As a result, the deposition serves as a mask to allow the silicon layer to be etched into a forwardly tapered configuration instead of being etched vertically.

The first aspect of the invention is preferable for etching only the silicon layer without etching layers under the silicon layer. However, a second aspect of the invention will be useful where etching may extend to underlying layers.

According to a second aspect of the invention, there is provided a method for etching a silicon layer comprises the steps of forming a mask pattern on a silicon layer and etching the silicon layer using a CF type gas or a mixed gas including the same.

In this method for etching, the CF type gas may be at least one kind of gas selected from among a group of gases consisting of $CF_4$, $CHF_3$, $CH_2F_2$ and $C_4F_8$ and a field oxide film having a thickness in the range from 0.3 $\mu$m to 0.5 $\mu$m may be provided under the silicon layer.

The second aspect of the invention is effective also in that the etching with a CF type gas leaves a fluorocarbon type deposition on the sides of the etched hole in the silicon layer to provide inclined etched sides similar to those obtained according to the first aspect of the invention and in that the etching gas may not be switched on the way of processing.

In the context of the present invention, the term "silicon layer" implies not only a silicon film formed on a substrate but also a silicon substrate. Obviously, a typical silicon layer is a polysilicon layer.

BRIEF DESCRIPTION OF THE DRAWINGS

FIG. 1 is a sectional view of a device structure for a flash memory having a floating gate and the like;

DESCRIPTION OF THE PREFERRED EMBODIMENTS

Preferred embodiments of the present invention will now be specifically described with reference to the accompanying drawings.

Figure 1:
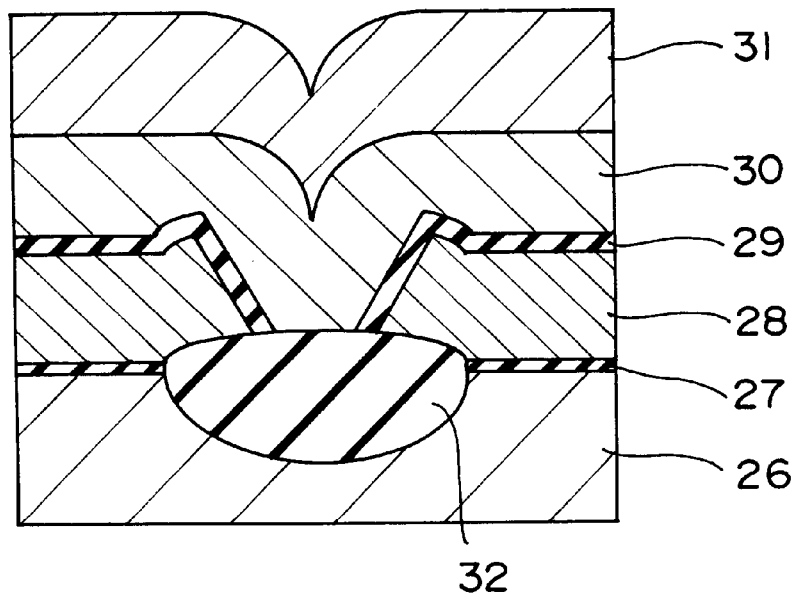
Figure 2:
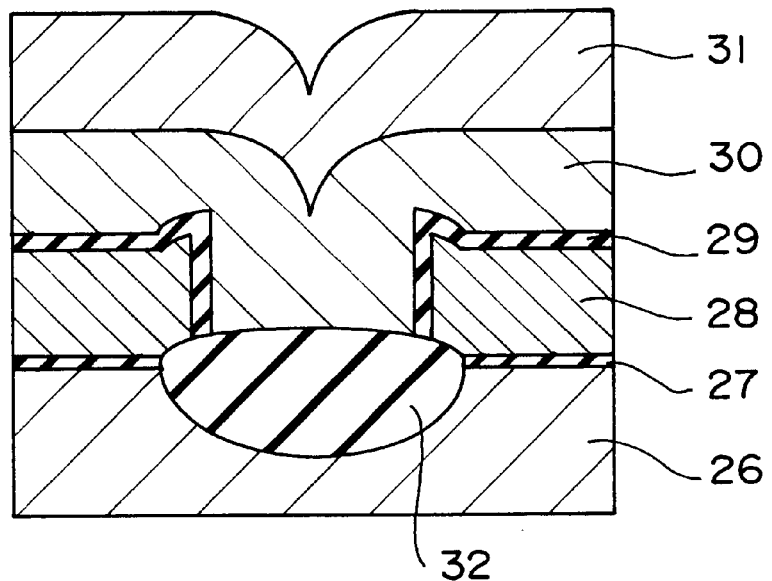
FIG. 2 is a sectional view showing a modification of the same.
Figure 3:
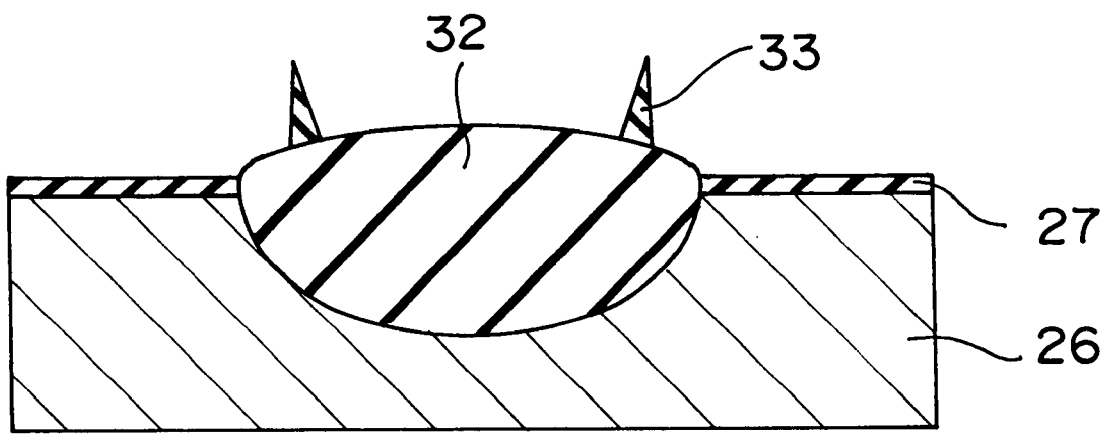
FIG. 3 is a sectional view showing a configuration obtained by etching the same.
Figure 4A:
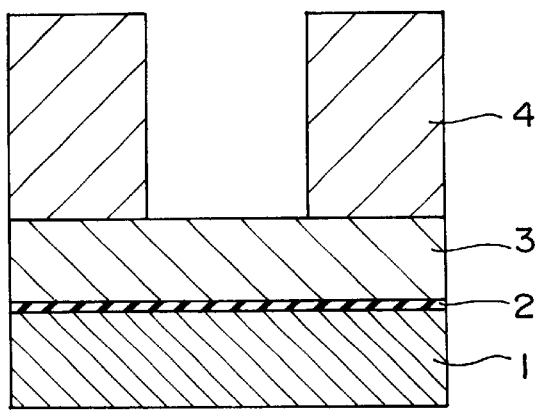
FIGS. 4A through 4C are sectional views showing a method according to a first embodiment of the invention in the order of steps thereof.
Figure 4B:
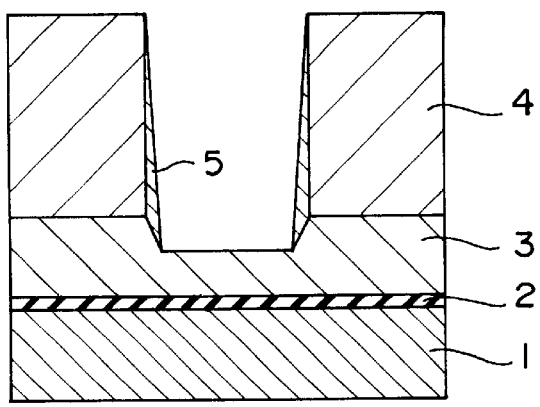
Figure 4C:
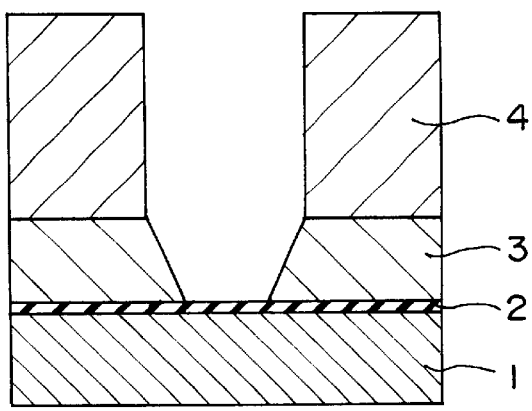
Figure 5:
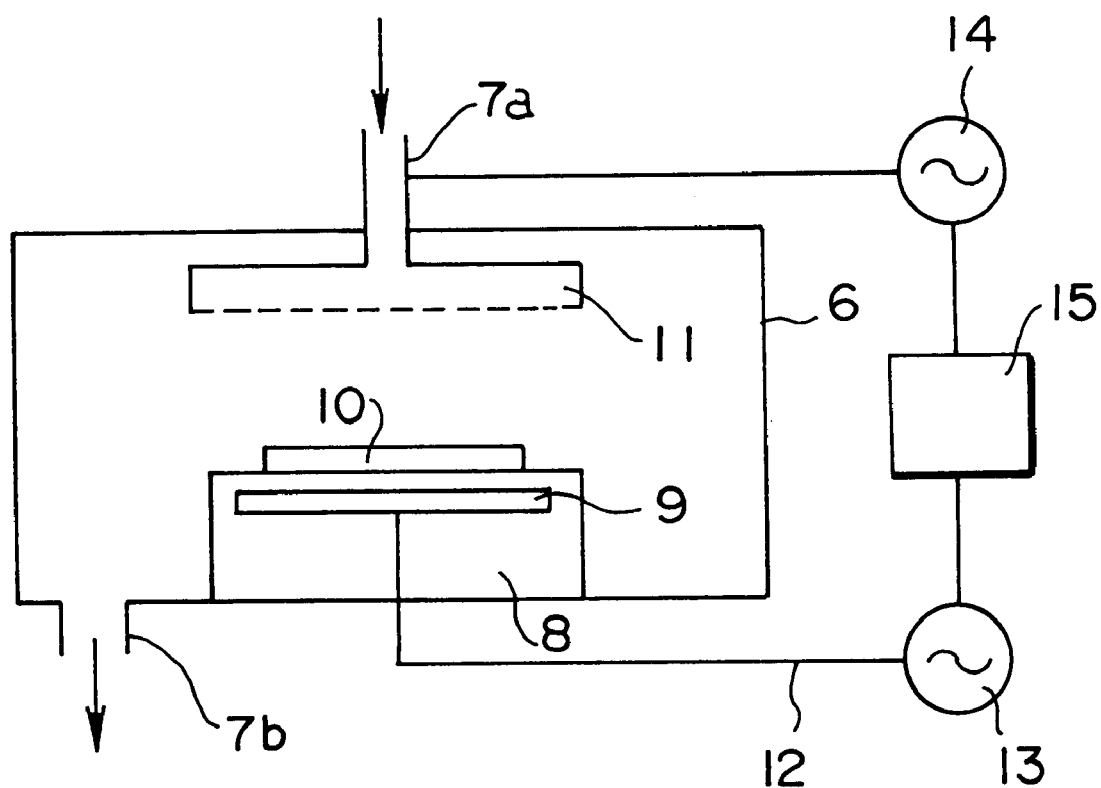
FIG. 5 is a schematic view showing an RIE etching apparatus used in the method of the first embodiment of the invention.

FIGS. 4A through 4C are sectional views showing a method for etching a silicon layer according to a first embodiment of the present invention in the order of steps thereof. FIG. 5 is a schematic illustration of a dry etching apparatus employing a dual frequency RIE method for etching a polysilicon layer in the present embodiment. As shown in FIG. 5, a chamber 6 of the dry etching apparatus has an intake port 7a and an exhaust port 7b for a material gas. An upper electrode 11 is suspended in the chamber 6, and a lower electrode 9 is provided on a stage 8 provided on the bottom of the chamber. A wafer 10 to be etched is placed on the stage 8. The upper electrode 11 functions as a shower head for injecting a material gas introduced through the material gas intake port 7a into the chamber and is connected to a high frequency power supply 14 for the upper electrode provided outside the chamber through a high frequency cable 12. The lower electrode 9 is connected to a high frequency power supply 13 for the lower electrode through a high frequency cable 12. A phase control modulator 15 is connected between the high frequency power supplies 13 and 14.

In the etching apparatus having such a configuration, high frequency power is applied to the upper and lower electrodes 9 and 11 in a face-to-face relationship to generate plasma and the phase difference between them is controlled by the phase control modulator 15 connected between the high frequency power supplies 13 and 14 to etch a silicon layer on the wafer 10 on an RIE (reactive ion etching) basis. This etching apparatus is capable of generating plasma having a plasma density on the order of $1 \times 10^{10}$ to $1 \times 10^{11}$ cm$^{-2}$.

The silicon layer is etched using such an etching apparatus. That is, as shown in FIG. 4A, a pattern of photoresist 4 is formed in a device structure which is a laminated layer structure consisting of a polysilicon layer 3 and an oxide film 2 formed on the silicon substrate 1. The photoresist 4 is used as a mask to etch only the polysilicon layer 3.

As a first step, as shown in FIG. 4B, the polysilicon layer 3 is etched halfway using a CF type gas such as $CF_4$, $CHF_3$, $CH_2F_2$ and $C_4F_8$ or a mixed gas including the same. As shown in FIG. 4B, this results in a fluorocarbon type deposition 5 on the side walls of the etched pattern, the thickness of the deposition increasing with the depth of the walls.

Then, a second step is performed to etch any residue of the polysilicon layer 3 using the gas of $Cl_2$, HBr, $SF_6$ or $O_2$ as shown in FIG. 4C. At this time, the CF type deposition 5 formed at the first step serves as a mask, and the polysilicon layer 3 is etched into a forwardly tapered configuration which is wider in the upper part thereof as shown in FIG. 4C instead of being etched vertically.

An example of processing conditions for the method for etching shown in FIGS. 4A through 4C will now be described. The thickness of the thermal oxidation film 2 formed on the silicon substrate 1 as an insulation film of a MOS transistor is in the range from 6 nm to 10 nm, and the thickness of the polysilicon layer 3 as a conductive film is in the range from 100 nm to 150 nm.

The etching conditions are as follows. The etching at the first step is carried out to form the fluorocarbon type deposition film with $CF_4$ of 50 sccm, a pressure of 20 mT, the high frequency power for the upper electrode at 0 W and the high frequency power for the lower electrode at 600 W. The etching time is in the range from about 10 seconds to a period of time spent before the end of the polysilicon layer 3 is detected, though the etching time depends on the desired configuration for etching. The rate at which the polysilicon layer is etched this time is in the range from 100 nm to 200 nm. The etching rate for the oxide film is substantially the same. Therefore, if overetching is carried out under the same conditions after the underlying oxide film 2 is exposed, the underlying oxide film 2 will be etched away. It is therefore necessary to change the etching conditions to provide a higher selection ratio for the oxide film. If the etching is carried out halfway the polysilicon layer 3, a configuration as shown in FIG. 4B will be left as a result of the etching. The fluorocarbon type deposition 5 as an etching deposition has been formed on the side walls of the etched polysilicon layer 3.

The etching at the second step is carried out to remove any residue of the polysilicon layer 3 left after the etching at the first step under the conditions of $Cl_2$ in the range from 50 sccm to 200 sccm, HBr in the range from 100 sccm to 200 sccm, a pressure in the range from 20 mT to 100 mT, the high frequency power for the upper electrode in the range from 300 W to 500 W, the high frequency power for the lower electrode in the range from 300 W to 600 W and a phase ratio of 135° between the upper and lower high frequency power. The etching rate for polysilicon at this time is in the range from 150 nm to 250 nm, and the etching rate for oxide film is in the range from 3 nm to 10 nm.

This etching is carried out to remove any residue of the polysilicon layer 3 left after the etching at the first step. The deposition film 5 serves as a mask to etch the polysilicon layer 3 into a forwardly tapered configuration as shown in FIG. 4C.

Figure 6A:
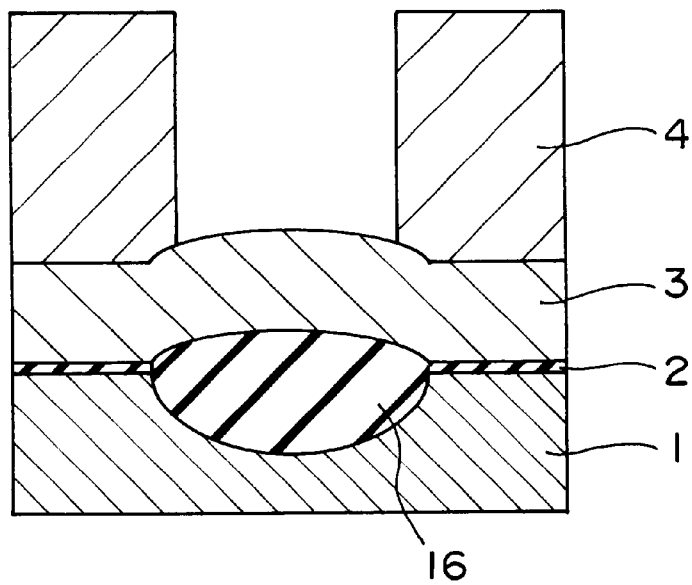
FIGS. 6A and 6B are sectional views showing a method according to a second embodiment of the invention in the order of steps thereof.
Figure 6B:
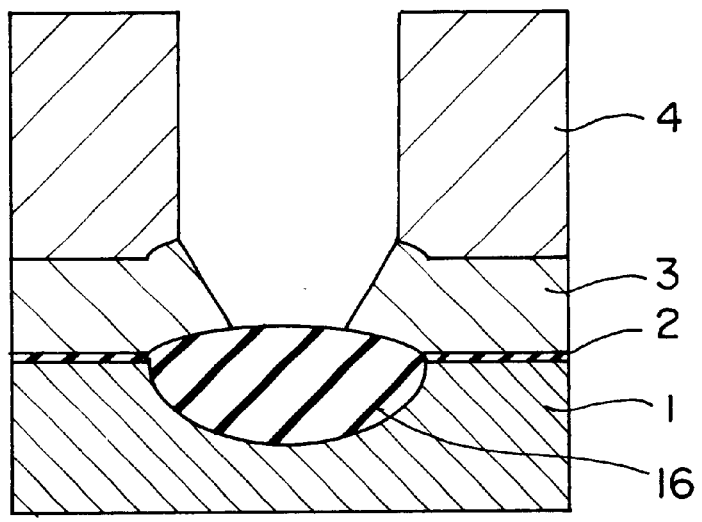

FIGS. 6A and 6B are sectional views showing a method for etching a silicon layer according to a second embodiment of the present invention in the order of steps thereof. Elements in FIGS. 6A and 6B identical to those in FIGS. 4A through 4C are indicated by same reference numbers and will not described in detail. In the present embodiment, as shown in FIG. 6A, a thick field oxide film 16 having a thickness in the range from 0.3 $\mu$m to 0.5 $\mu$m is formed under a region to be etched of a gate oxide film 2 under a polysilicon layer 3.

In this case, as a first step, the entire polysilicon layer 3 is etched using a CF type gas such as $CF_4$, $CHF_3$, $CH_2F_2$ and $C_4F_8$ or a mixed gas including the same as shown in FIG. 6B. This also results in a fluorocarbon type deposition on the side walls of the etched pattern, the thickness of the deposition increasing with the depth of the walls. This results in inclined sides after etching. Since the field oxide film 16 is thick enough, it is permitted to etch this film to a depth on the order of 0.1 $\mu$m.

While the $CF_4$ gas is generally used as the CF type gas, the effect of this invention can be achieved with gases such as $CHF_3$, $CH_2F_2$ and $C_4F_8$ which have a strong tendency to form a deposition.

When the pressure is increased to 20 mT or more, the tendency of deposition is enhanced as a result of an increase in residence time, which makes it possible to provide a configuration tapered at a higher degree in the forward direction.

The addition of a diluent gas such as He, Ar or the like under the etching conditions according to this embodiment makes it possible to adjust the amount of the deposition on the side walls of the pattern thereby to control the taper angle.

Figure 7A:
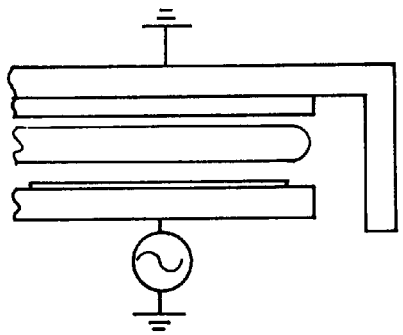
FIGS. 7A 7B, and 7C are schematic views showing of an etching apparatus used in the method of the second embodiment of the invention.
Figure 7B:
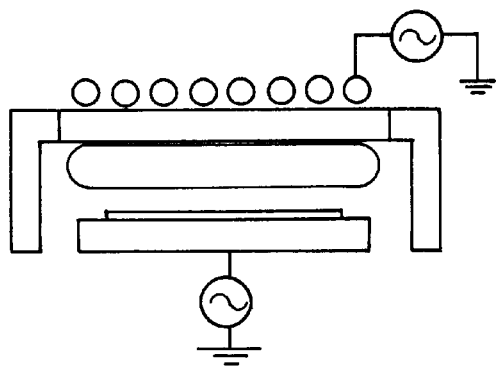
Figure 7C:
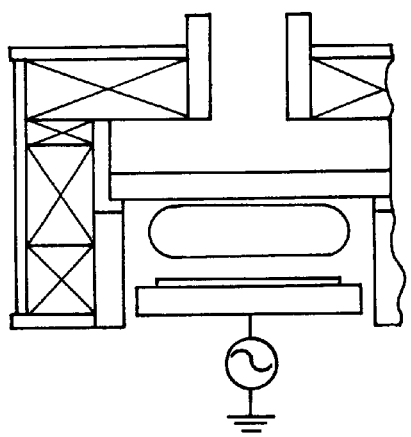

Further, it is possible to use an RIE apparatus as shown in FIG. 7A, an ICP apparatus as shown in FIG. 7B or an ECR apparatus as shown in FIG. 7C instead of the RIE etching apparatus shown in FIG. 5.

Figure 8A:
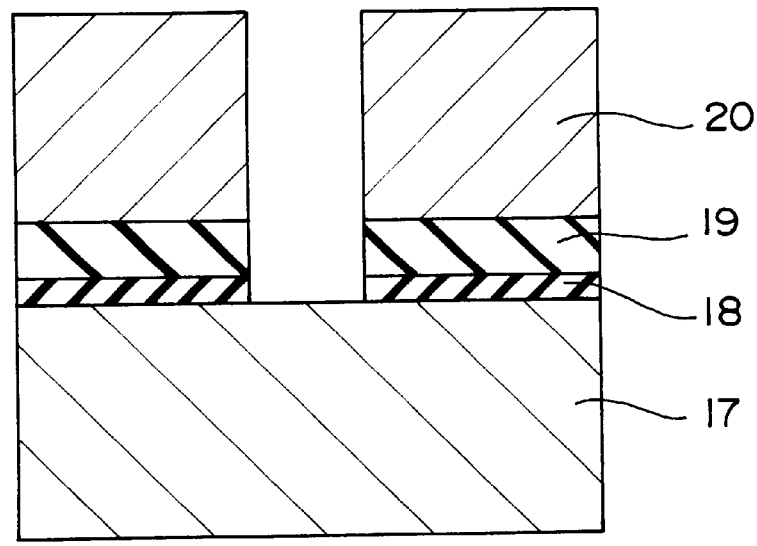
FIGS. 8A and 8B are sectional views showing a method according to a third embodiment of the invention in the order of steps thereof.

A description will now be made with reference to FIGS. 8A and 8B on an embodiment in which the present invention is used for the etching of a silicon trench. As shown in FIG. 8A, an oxide film 18 having a thickness in the range from 10 nm to 20 nm and a nitride film 19 having a thickness in the range from 100 nm to 150 nm are formed on a silicon substrate 17 and, thereafter, a pattern of photoresist 20 is formed thereon.

The method for etching according to the present invention is carried out on the structure shown in FIG. 8A to etch the silicon substrate 17. The etching conditions are the same as those described above.

Figure 8B:
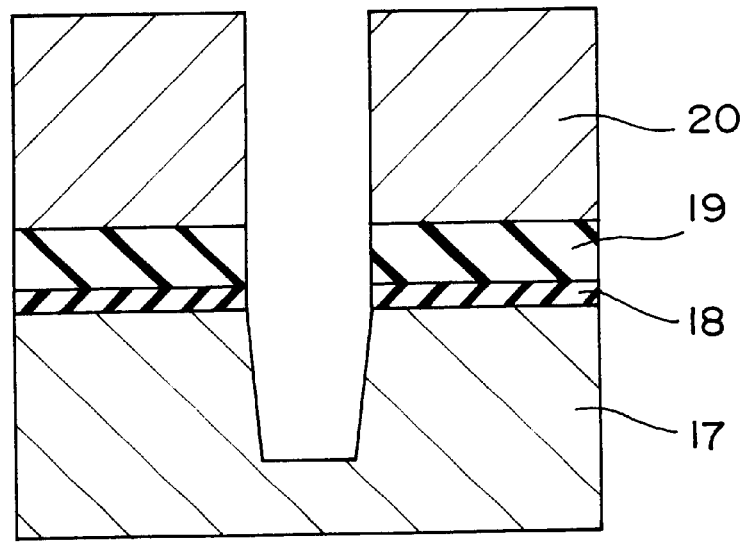

This results in an etched hole having inclined sides in the silicon substrate 17 as shown in FIG. 8B. Since a forwardly tapered etched configuration is thus obtained in the silicon, the hole can be buried preferably during a subsequent step for growing an oxide film.

Figure 9A:
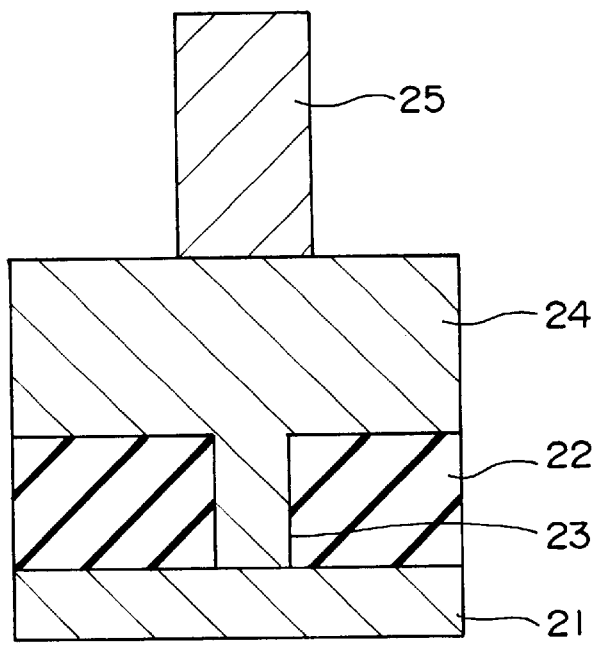
FIGS. 9A and 9B are sectional views showing a method according to a fourth embodiment of the invention in the order of steps thereof.

A description will now be made with reference to FIGS. 9A and 9B on an embodiment in which the present invention is used for the etching of a capacitor element. As shown in FIG. 9A, the device has a structure before etching in which an oxide film 22 is formed on a silicon substrate 21, a contact hole 23 is formed in the oxide film 22; a polysilicon film 24 to serve as a capacitor element later is thereafter formed; and a pattern of photoresist 25 is formed on the polysilicon film 24 in alignment with the contact hole 23.

Figure 9B:
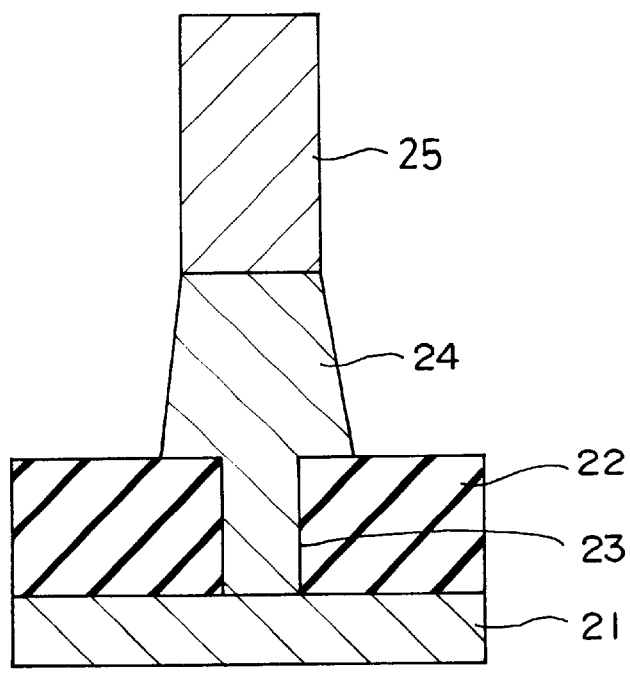

Next, as shown in FIG. 9B, the polysilicon film 24 is etched using the photoresist 25 as a mask according to the inventive method for etching. Since the polysilicon film 24 is to serve as a capacitor element later, it must have a large surface area. The use of the method for etching according to the invention will provide the polysilicon film 24 after etching with sides inclined relative to the surface of the substrate 21 to provide the so-called forwardly tapered configuration. This makes it possible to increase the surface area of the capacitor element. As described above, according to the present invention, the use of a CF type gas leaves a fluorocarbon type deposition on side walls of an etched pattern to provide a silicon layer (including a silicon substrate) with a configuration having inclined sides after etching. The present invention provides significant advantages in semiconductor manufacturing steps including the fact that the step coverage of an upper layer buried in an etched hole can be improved and the like.

What is claimed is:

1. A method for etching a silicon layer to form a floating gate of a flash memory, comprising the steps of:
    (a) forming a mask pattern on a layer consisting essentially of silicon to form a silicon layer which is formed on an oxide layer said mask pattern having vertical sidewalls;
    (b) forming an etched pattern having a fluorocarbon type deposition on sidewalls of the mask pattern and on sidewalls of the silicon layer by partially etching said silicon layer by an anisotropic reactive ion etching method using a CF type gas or a mixed gas including the CF type gas, said fluorocarbon deposition being thicker with increasing depth along said etch pattern, so that a width of said etch pattern along said silicon layer, absent said fluorocarbon deposition, is smaller with increasing depth; and
    (c) using the fluorocarbon type deposition as a mask, and after step (b), etching any residue of said silicon layer by an anisotropic reactive ion etching method using at least one kind of gas different from said CF type gas and selected from the group of gases consisting of $Cl_2$, HBr, $SF_6$ and $O_2$ to form a resultant etch pattern along said silicon layer having a width which decreases with increasing depth.

2. A method for etching a silicon layer according to claim 1, wherein said CF type gas is at least one kind of gas selected from the group of gases consisting of $CF_4$, $CHF_3$, $CH_2F_2$ and $C_4F_8$.

3. A method for etching a silicon layer according to claim 1, wherein an oxide film having a thickness in the range from 6 nm to 10 nm is formed under said silicon layer.

4. A method for etching a silicon layer to form a floating gate of a flash memory comprising:
    forming a mask pattern having vertical sidewalls on a layer consisting essentially of silicon to form a silicon layer formed on a gate oxide film and a field oxide film, said method including the steps of:
    (1) etching the silicon layer on the gate oxide film by,
        (a) etching said silicon layer partially by a reactive ion etching method using a CF type gas or a mixed gas including the CF type gas while depositing a fluorocarbon type deposition on sidewalls of the etched pattern so as to form a tapered deposition which is thicker with increasing depth and such that a width of said etch pattern along said silicon layer, absent said fluorocarbon deposition, is smaller with increasing depth, and then
        (b) after step (a), etching any residue of said silicon layer by a reactive ion etching method using at least one kind of gas different from said CF type gas and selected from the group consisting Of $Cl_2$, HBr, $SF_6$ and $O_2$ to form a resultant etch pattern along said silicon layer having a width which decreases with increasing depth; and
    (2) etching the silicon layer on the field oxide film by,
        (a) etching said silicon layer over the whole thickness of the silicon layer formed on a field oxide film by a reactive ion etching method using a CF type gas or a mixed gas including the CF type gas while depositing fluorocarbon type deposition on sidewalls of the etched pattern so as to form a tapered deposition which is thicker with increasing depth;
        (b) wherein said silicon layer is etched in a taper configuration.

5. The method for etching a silicon layer according to claim 4, wherein said CF type gas is at least one kind of gas selected from the group of gases consisting of $CF_4$, $CHF_3$, $CH_2F_2$ and $C_4F_8$.

6. The method for etching a silicon layer according to claim 4, wherein the thickness of said field oxide film is in the range from 0.3 to 0.5 $\mu$m.

7. The method for etching a silicon layer according to claim 4, wherein the thickness of said gate oxide film is in the range from 6 nm to 10 nm.

* * * * *